United States Patent [19]

Yamazaki

[11] Patent Number: 5,012,320
[45] Date of Patent: Apr. 30, 1991

[54] SEMICONDUCTOR DEVICE HAVING HIGH-RELIABLE INTERCONNECTIONS WITH TITANIUM SILICIDE FILM

[75] Inventor: Kouji Yamazaki, Tokyo, Japan

[73] Assignee: NEC Corporation, Japan

[21] Appl. No.: 397,015

[22] Filed: Aug. 21, 1989

[30] Foreign Application Priority Data

Aug. 24, 1988 [JP] Japan .................................. 63-211219

[51] Int. Cl.⁵ .......................................... H01L 23/48
[52] U.S. Cl. .................................. 357/67; 357/23.1; 357/59; 357/71
[58] Field of Search ................. 357/23, 59 I, 59 T, 357/71 S, 67 S

[56] References Cited

U.S. PATENT DOCUMENTS

| | | | |
|---|---|---|---|
| 4,276,557 | 6/1981 | Levinstein et al. | 357/59 I |
| 4,533,935 | 8/1985 | Mochizuki | 357/51 |
| 4,673,968 | 6/1987 | Hieber et al. | 357/71 S |

*Primary Examiner*—Edward J. Wojciechowicz
*Attorney, Agent, or Firm*—Laff, Whitesel, Conte & Saret

[57] ABSTRACT

A semiconductor device according to the present invention has a multiple-level gate electrode which consists of a lower polysilicon strip and an upper titanium silicide film containing a titanium oxide instead of boron or carbon for preventing the titanium silicide film from reduction in resistivity, and the device characteristics are not deteriorated, because the oxygen bonded to the titanium is stable in heat treatments and hardly diffused into the substrate.

11 Claims, 11 Drawing Sheets

SEMICONDUCTOR DEVICE HAVING HIGH-RELIABLE INTERCONNECTIONS WITH TITANIUM SILICIDE FILM

FIELD OF THE INVENTION

This invention relates to a semiconductor device and, more particularly, to high-reliable gate electrode and interconnection with titanium silicide films incorporated therein.

DESCRIPTION OF THE RELATED ART

The general requirements for gates and interconnections are that the film material is small in resistivity, stable throughout the remaining process steps and reliable. Refractory metals such as titanium silicide, tungsten silicide and molybdenum silicide have proposed and used as gate electrode materials either alone or with doped polysilicon. An example of such a titanium silicide film is disclosed by Michaele W. Alperin et al in "Development of the Self-Aligned Titanium Silicide Process for VLSI Applications", IEEE Transactions on Electron Devices, vol. ED-32, No, 2, February 1985, pages 141 to 149. The paper written by Alperin et al teaches a multiple-level structure consisting of a lower polysilicon film and an upper titanium silicide film for a gate electrode of a MOS field effect transistor, and the source and drain regions are also covered with titanium silicide films, respectively, for improvement in sheet resistance. However, the titanium silicide films are subjected with heat treatment ranging between 900 degrees and 1000 degrees in centigrade in the later stage of the process sequence, and consequently, the titanium silicide films are liable to be deformed into elevated configurations or agglomerations due to thermal stress. This elevated configuration per se deteriorates the sheet resistance of the multiple-level interconnection, and an irregularity of the sheet resistance takes place in the conductive patterns. The undesirable phenomenon is reported and discussed by Rama K. Shukla et al in "Thermal Stability of Titanium Silicide Thin Films", Proceeding of VLSI Multilevel Interconnection Conference, June 15th to 16th, 1987, pages 470 to 479.

For providing a solution of this problem, a titanium silicide doped with boron atoms is proposed by K. Suguro et al, in "Impurity Effect on Reduction in Thermal Stress of Titanium Silicides", Extended Abstracts of the 19th Conference on Solid State Devices and Materials, Tokyo, 1987, pages 423 to 426. Similar proposal is found in "Implantation of Carbon to Stabilize $TiSi_2$ during Thermal Annealing" reported by L. R. Zheng et al, Nuclear Instruments and Methods in Physics Research B19/20(1987), pages 598 to 602, North-Holland, Amsterdam. In the papers, the implanted boron atoms and carbon atoms react on titanium to form boride represented by the molecular formula of $TiB_2$ and carbide represented by TiC, and these stable compounds tend to remove the thermal stress. In fact, the titanium silicide film doped with boron atoms or carbon atoms is free from the agglomerations even if the film is elevated to 900 degrees to 1000 degrees in centigrade, and accordingly, the sheet resistance is stable across the heat treatment. In other words, if an integrated circuit is fabricated on a semiconductor chip by connecting circuit component transistors with the multiple-level interconnections of the doped titanium silicide, predetermined characteristics are achieved by the circuit component transistors, because no irregularity takes place in the interconnections.

Thus, the thermal stability is achieved by the titanium silicide film doped with the boron or carbon, however, a problem is encountered in that p-type impurity regions and energy levels due to crystal defects are liable to take place in the semiconductor substrate and the interconnections. This is because of the fact that the boron atoms or the carbon atoms tend to be diffused from the doped titanium silicide into the semiconductor substrate. Those unintentional p-type impurity regions and the energy levels give rise to deterioration in the characteristics of the circuit component transistors and, as a result, of the integrated circuit.

SUMMARY OF THE INVENTION

It is therefore an important object of the present invention to provide a semiconductor device which has a low-resistive, stable and reliable multiple-level interconnection without any sacrifice of the device characteristics.

It is also an important object of the present invention to provide a semiconductor device which is free from unintentional impurity regions and undesirable energy levels due to the crystal defects produced in the semiconductor substrate.

To accomplish these objects, the present invention proposes to produce a titanium oxide in the titanium silicide.

In accordance with the present invention, there is provided a semiconductor device fabricated on a silicon substrate, comprising: (a) a transistor having impurity regions and a multiplelevel control electrode for causing carriers to travel from one of the impurity regions to another impurity region, and (b) an interconnection coupled at one end thereof to the transistor for providing a conduction path, in which the multiple-level control electrode has a lower conductive strip formed of a polycrystalline silicon and an upper titanium silicide film containing oxygen atoms in the form of a titanium oxide. The amount of the oxygen atoms may range from about $10^{19}$ atoms/$cm^3$ and to about $10^{21}$ atoms/$cm^3$.

BRIEF DESCRIPTION OF THE DRAWINGS

The features and advantages of a semiconductor device according to the present invention will be more clearly understood from the following description taken in conjunction with the accompanying drawings in which.

DESCRIPTION OF THE PREFERRED EMBODIMENTS

First embodiment

Figure 1A:
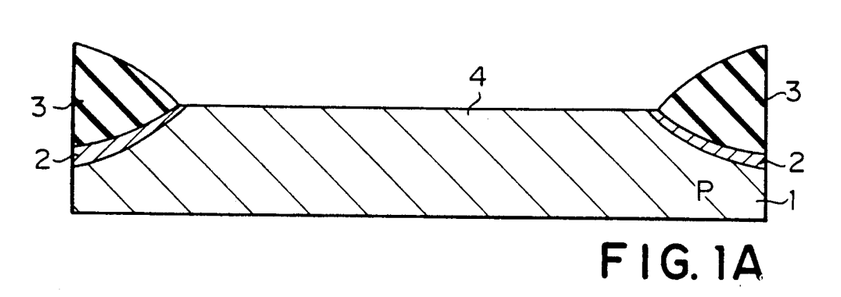
FIGS. 1A to 1G are cross sectional views showing the process sequence used for fabricating a field effect transistor embodying the present invention.

Description is hereinunder made for a process sequence used for fabricating a semiconductor device according to the present invention with reference to FIGS. 1A to 1G. The process starts with preparing a <100> oriented p-type single crystalline silicon substrate 1, and the silicon substrate 1 has a resistivity of about 10 ohm-cm. First, channel stoppers 2 are formed in the silicon substrate 1, and a thick field oxide film 3 is grown on the substrate 1 by using the localized oxidation of silicon technique. The thick field oxide film 3 defines an active device area 4, and the resultant structure of this stage is illustrated in FIG. 1A.

Figure 1B:
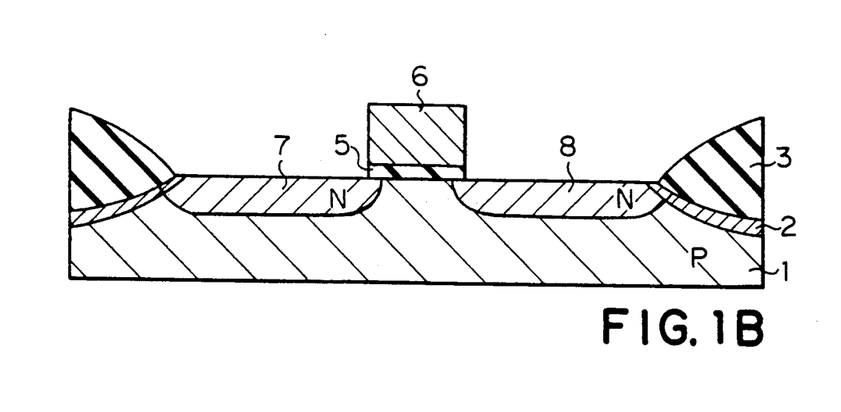

The silicon substrate 1 is placed in an oxidation ambient to grow a thin silicon oxide film to a thickness of about 200 angstroms, and a polycrystalline silicon film is deposited to a thickness of about 4000 angstroms on the entire surface of the structure by pyrolyzing silane ($SiH_4$) at about 600 degrees in centigrade. The thin silicon oxide film provides a gate oxide film 5. Phosphorus atoms are doped into the polycrystalline silicon film at about 820 degrees in centigrade for an hour, and $POCl_3$ is used for the post doping. The sheet resistance of the polycrystalline silicon film is adjusted to about 60 ohm/sq. The polycrystalline silicon film is, then, etched and patterned to form a gate electrode 6 by using a reactive ion etching technique, and a gaseous mixture containing $CF_4$ is used as an etchant. In this instance, the gate electrode 6 is about 1 micron width. When the gate electrode 6 is formed, n-type impurity atoms are ion implanted into the active device area 4 in a self-aligned manner with the accelerate energy of about 30 KeV. at the dose of about $3 \times 10^{13}$ cm$^{-2}$, thereby forming n-type source and drain regions 7 and 8. The substrate 1 is paced in a high temperature ambient of about 900 degrees in centigrade for about 10 minutes for the sake of activation of the implanted impurities. The resultant structure of this stage is illustrated in FIG. 1B.

Figure 1C:
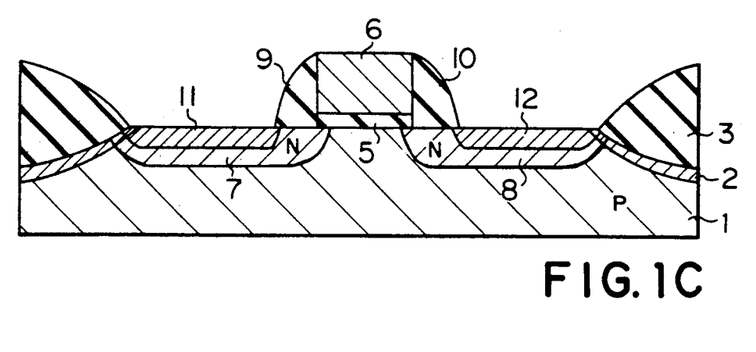

Subsequently, the substrate 1 is disposed in a reactor, and a gaseous mixture of silane and oxygen is provided in the reactor for deposition of a silicon oxide. Then, a silicon oxide film is deposited on the entire surface of the structure by pyrolyzing silane at about 400 degrees in centigrade, and the silicon oxide film is anisotropically etched to form side walls 9 and 10. In this instance, the anisotropical etching is of the reactive ion etching, and $CF_4$ gas is used as the etchant. After the formation of the side walls 9 and 10, arsenic atoms are ion implanted into the active device area with accelerate energy of about 70 KeV. at dose of about $3 \times 10^{15}$ cm$^{-2}$ so that heavily doped n-type source and drain regions 11 and 12 are formed in a self-aligned manner with the side walls 9 and 10. The implanted arsenic atoms are activated through a heat treatment at about 900 degrees in centigrade for about thirty minutes. Thus, the LDD (Lightly Doped Drain) structure is formed in the active device area 4 as shown in FIG. 1C.

Figure 1D:
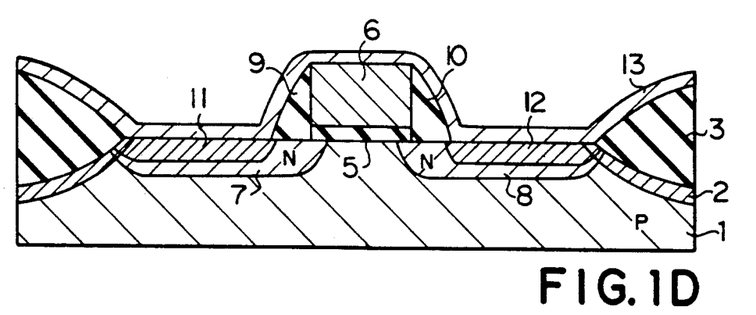

The resultant structure is placed in a DC magnetron sputtering system, and a titanium target containing about 10% oxygen by atom is sputtered to deposit a titanium film 13 to a thickness of about 800 angstroms on the entire surface of the structure as shown in FIG. 1D.

Figure 1E:
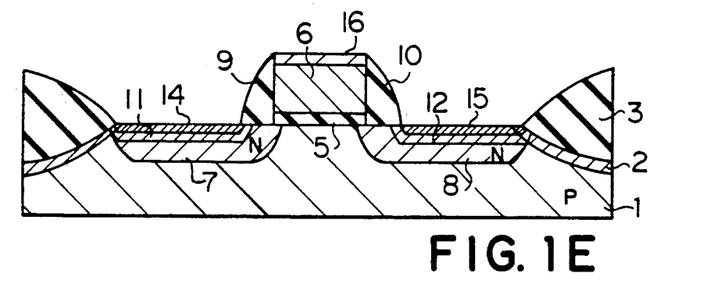
Figure 2:
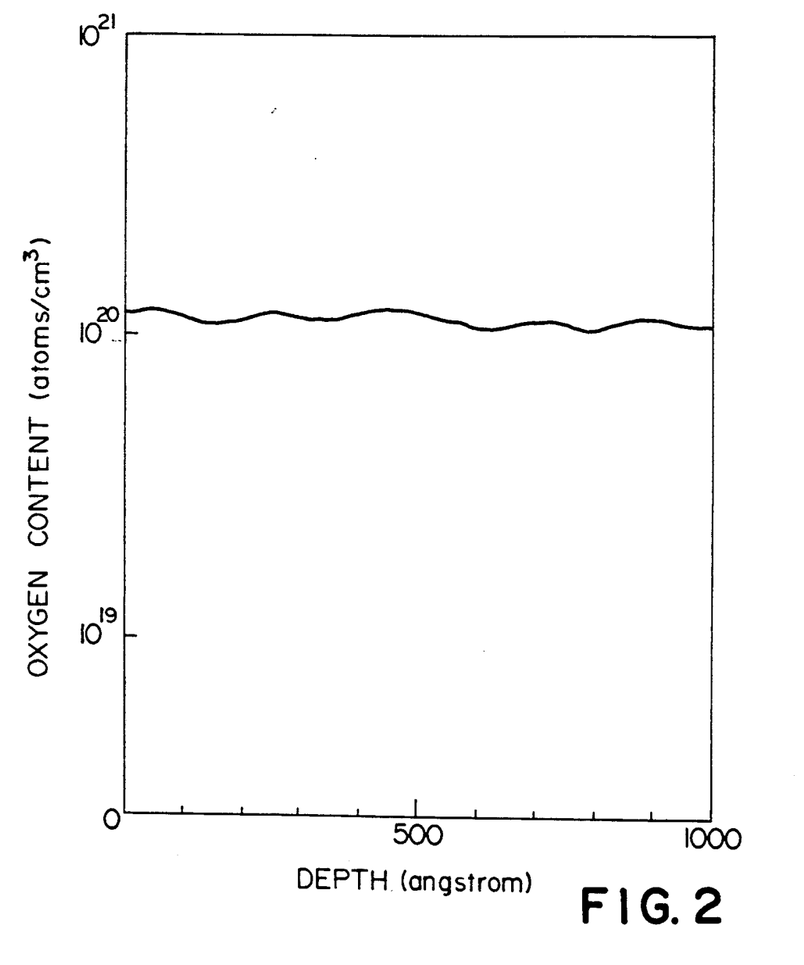
FIG. 2 is a graph showing the oxygen content in terms of the depth of the titanium silicide film incorporated in the field effect transistor fabricated through the process sequence shown in FIGS. 1A to 1G.

The titanium film 13 thus deposited is annealed in an nitrogen ambient at about 650 degrees in centigrade for about 10 minutes, and consequently, a titanium silicide films 14, 15 and 16 are formed on the heavily doped source and drain regions 11 and 12 and the polycrystalline silicon gate electrode 6. The titanium silicide films 114 to 116 are about 1000 angstroms thick. Ammonia, hydrogen peroxide and water are mixed in a proportion of 1:1:5, and the non-converted or residual titanium are removed in the solution. The resultant structure of this stage is illustrated in FIG. 1E. The oxygen content of the titanium films 14 to 16 is dependent upon the depth of the films, and is largely uniform throughout the depth as shown in FIG. 2 of the drawings.

Figure 1F:
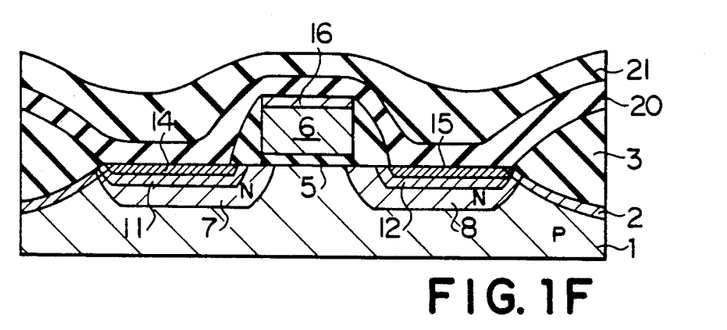

A silicon oxide film 20 is deposited to a thickness of about 1000 angstroms on the entire surface of the structure by pyrolyzing silane with oxygen at about 400 degrees in centigrade, and, thereafter, a boron-phosphosilicate glass film 21 is deposited to a thickness of about 6000 angstroms on the silicon oxide film 20 by the pyrolyzing technique at about 400 degrees in centigrade using a gaseous mixture of $SiH_4$, $B_2H_6$, $PH_4$ and $O_2$. A heat treatment is carried out in a nitrogen ambient at about 900 degrees in centigrade for about thirty minutes so that a smooth topography is created through the reflow of the boron-phosphosilicate glass. The resultant structure of this stage is illustrated in FIG. 1F.

Figure 1G:
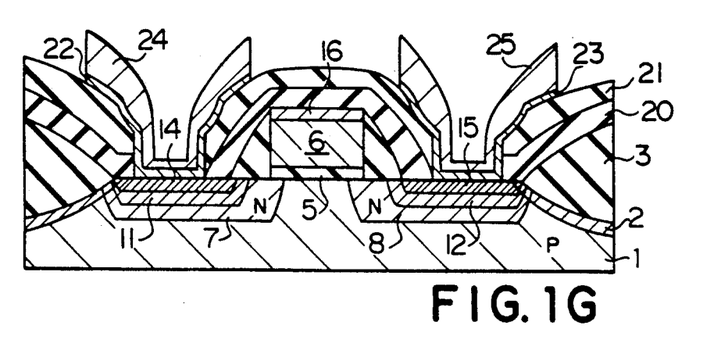

A mask player is provided on the boron-phosphosilicate glass film 21 by using lithographic techniques, and the boron-phosphosilicate glass film 21 and the silicon oxide film 20 are selectively removed by using a reactive ion etching technique using a gaseous mixture of $CHF_3$ and $O_2$ so that contact holes are formed in the boron-phosphosilicate glass film 21 and the silicon oxide film 20, exposing the titanium silicide films 14 and 15. The substrate 1 is placed in the DC magnetron sputtering system, and a tungsten target is sputtered to form a tungsten silicide film of about 1000 angstroms. Subsequently, an aluminum alloy containing silicon is deposited to a thickness of about 6000 angstroms, and, consequently, an aluminum alloy film is formed on the tungsten film. These films are patterned by using a reactive ion etching technique so that barrier metal films 22 and 23 and metal wiring strips 24 and 25 are formed in contact with the titanium silicide films 14 and 15. Thus, a MOS type field effect transistor is fabricated through the process sequence according to the present invention, and the resultant structure is illustrated in FIG. 1G.

As described hereinbefore, the titanium silicide films 14, 15 and 16 contain the oxygen atoms which are bonded to the titanium atoms, and the titanium-bonded oxygen is stable. This results in that diffusion hardly takes place in the MOS type field effect transistor. In fact, after the heat treatment at about 900 degrees in centigrade for about thirty minutes for the reflow stage of the boron-phosphosilicate glass, the titanium silicide films 14 to 16 do not increase the resistivities, and, accordingly, no irregularity takes place therein.

Figure 3:
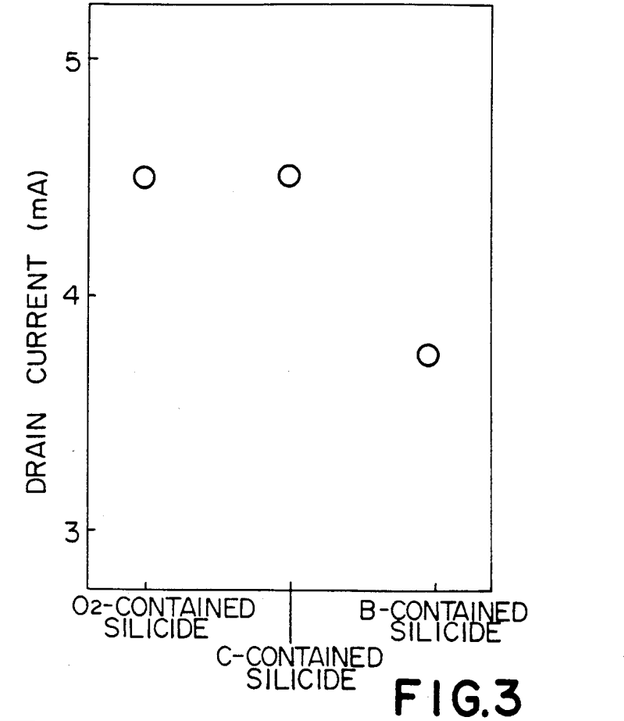
FIG. 3 is a graph showing the amounts of the drain currents of the field effect transistor of the present invention as well as the prior art field effect transistors.

FIG. 3 illustrates gate voltage-to-drain current characteristics between the MOS type field effect transistor fabricated through the process shown in FIGS. 1A to 1G and prior art MOS field effect transistors which have the multiple-level gate electrodes and interconnections consisting of the titanium silicide films doped with boron and carbon, respectively. A biasing voltage of about +5 volts is applied between the gate electrodes and the substrates of both MOS field effect transistors, and the source-and-drain voltage levels are adjusted to about +5 volts. The MOS type field effect transistor of the present invention is as large in the drain current driving capability as the prior art MOS type field effect transistor with the carbon-contained titanium silicide films, and is larger than the prior art MOS type field effect transistor with the boron-contained titanium silicide films.

Figure 4:
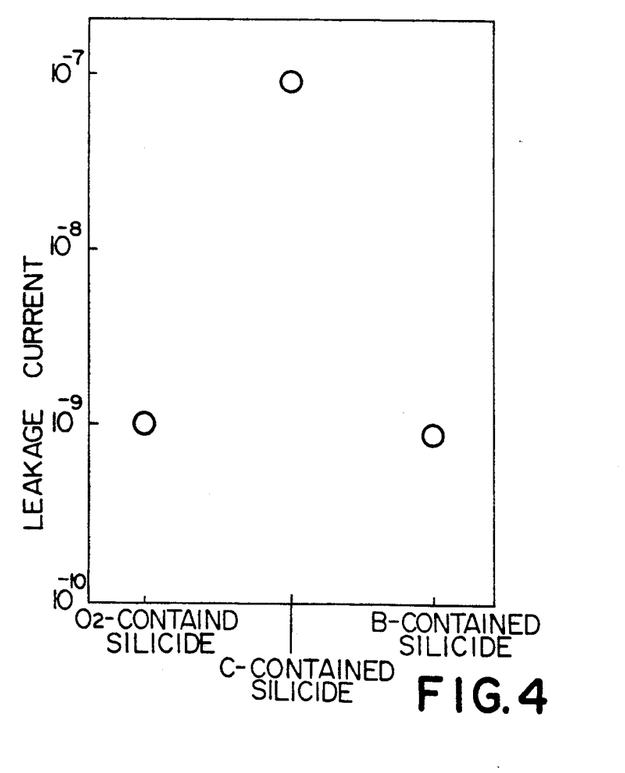
FIG. 4 is a graph showing the amounts of the leakage currents of the field effect transistor of the present invention as well as the prior art field effect transistors.

The MOS type field effect transistor according to the present invention is further superior in leakage current to the prior art MOS type field effect transistors. Sixth-four thousand MOS type field effect transistors according to the present invention are integrated on a single semiconductor chip and are coupled in parallel, and the prior art MOS type field effect transistors are also integrated on respective semiconductor chips and are coupled in parallel to form integrated circuits, respectively. Each of the integrated circuits is equal in the number of the component transistors to the integrated circuit with the MOS field effect transistors of the present invention. When the MOS type field effect transistors are applied with 5 volts between the sources and drains in the conditions where the gate electrodes and the substrates are grounded, the amount of leakage current is measured for each of the integrated circuits, and is plotted on a graph shown in FIG. 4. As will be understood from the graph, the MOS type field effect transistor according to the present invention is as small in the amount of the leakage current as the prior art MOS type field effect transistor with the boron-contained titanium silicide films, and is smaller than the prior art MOS type field effect transistor with the carbon-contained titanium silicide films. In general, since the amount of the leakage current is proportional to the amount of undesirable energy levels due to the crystal defects, the silicon substrate is less affectable to the oxygen atoms contained in the titanium silicide films of the MOS type field effect transistor according to the present invention. Thus, the MOS type field effect transistor of the present invention is advantageous in device characteristics over the prior art MOS type field effect transistors by virtue of the oxygen-contained titanium silicide films.

Figure 5:
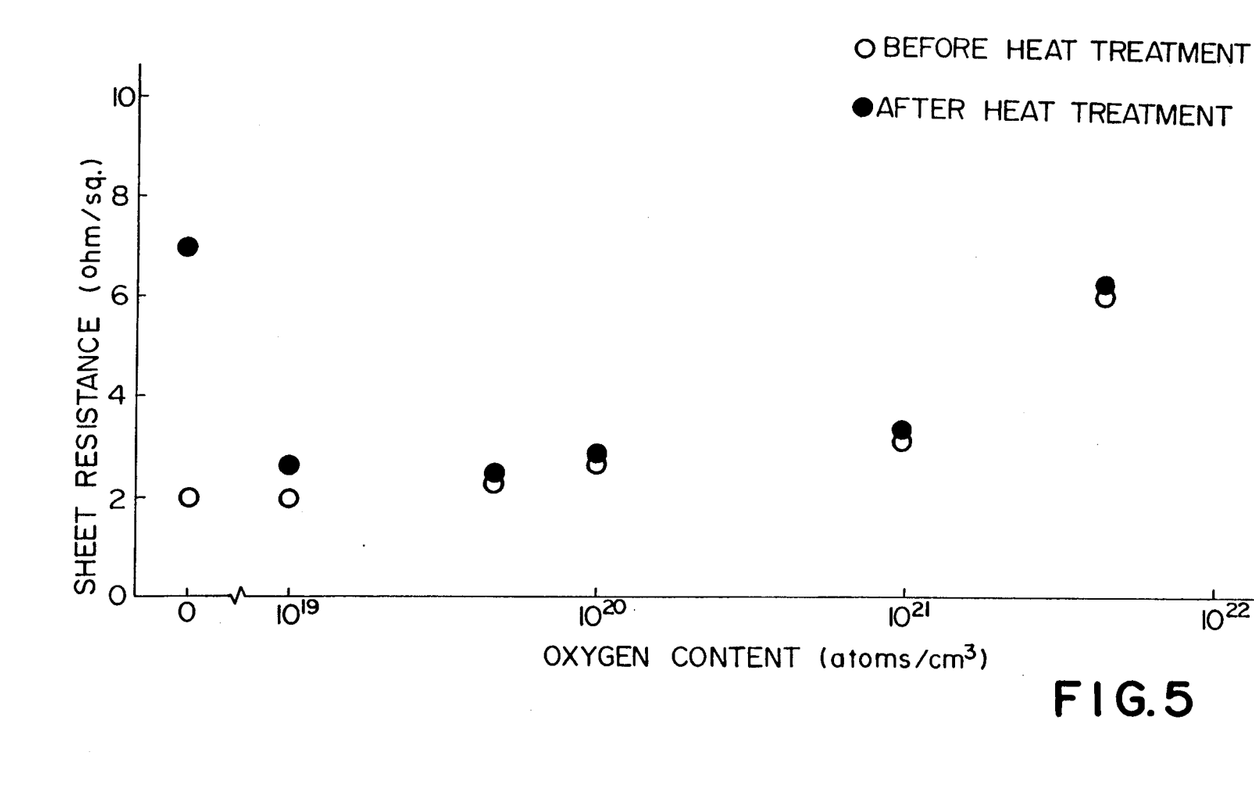
FIG. 5 is a graph showing the sheet resistance of the titanium silicide film in terms of the oxygen content.

The amount of the oxygen atoms contained in each of the titanium silicide films 14 to 16 is of the order of $10^{20}$ atoms/cm$^3$ throughout the depth of the film as shown in FIG. 2. This is because of the fact that the sheet resistance of each titanium silicide film is less susceptible to a heat treatment in so far as the oxygen content ranges between $10^{19}$ atoms/cm$^3$ and $10^{21}$ atoms/cm$^3$. FIG. 5 shows sheet resistance in terms of oxygen content. First, titanium silicide films different in oxygen content are formed to a thickness of about 1000 angstroms, and the sheet resistances are measured. The sheet resistances are represented by bubbles, respectively. The titanium silicide films are, then, heated in a nitrogen ambient at about 900 degrees in centigrade for an hour. The sheet resistances are measured again, and are represented by dots. As will be understood from FIG. 5, the sheet resistance is relatively low and less susceptible under the oxygen content between $10^{19}$ atoms/cm$^3$ and $10^{21}$ atoms/cm$^3$. This range is tantamount to oxygen concentration between 0.5% and 5% by atom. The titanium silicide film are observed by using an X-ray photoelectron spectroscopy (XPS) system, and oxygen-bonded titanium or an titanium oxide is confirmed.

SECOND EMBODIMENT

FIGS. 6A to 6G show another process sequence for fabricating a MOS type field effect transistor according to the present invention. The MOS type field effect transistor is characterized by titanium silicide films each graded in oxygen content.

Figure 6A:
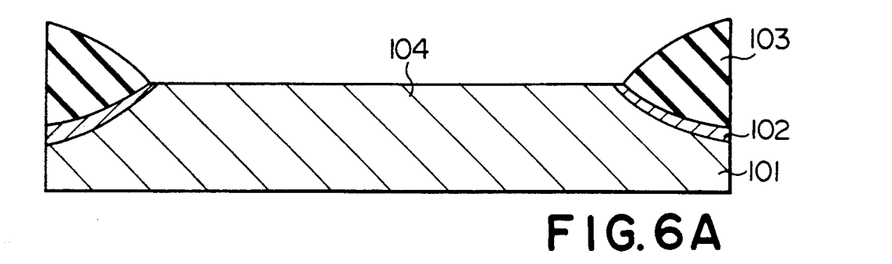
FIG. 6A to 6G are cross sectional views showing another process sequence for fabricating a field effect transistor embodying the present invention.

The process starts with preparing a <100> oriented p-type single crystalline silicon substrate 101, and the silicon substrate 101 has a resistivity of about 10 ohm-cm. First, channel stoppers 102 are formed in the silicon substrate 101, and a thick field oxide film 103 is grown on the substrate 101 by using the localized oxidation of silicon technique. The thick field oxide film 103 defines an active device area 104, and the resultant structure of this stage is illustrated in FIG. 6A.

Figure 6B:
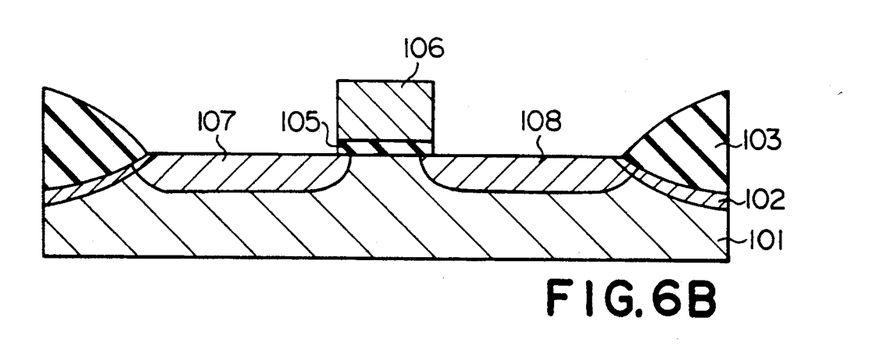

The silicon substrate 101 is placed in an oxidation ambient to grow a thin silicon oxide film to a thickness of about 200 angstroms, and a polycrystalline silicon film is deposited to a thickness of about 4000 angstroms on the entire surface of the structure by pyrolyzing silane at about 600 degrees in centigrade. The thin silicon oxide film provides a gate oxide film 105. Phosphorus atoms are doped into the polycrystalline silicon film at about 820 degrees in centigrade for an hour, and POCl$_3$ is used for the post doping. The sheet resistance of the polycrystalline silicon film is adjusted to about 60 ohm/sq. The polycrystalline silicon film is, then, etched and patterned to form a gate electrode 106 by using a reactive ion etching technique, and a gaseous mixture containing CF$_4$ is used as an etchant. In this instance, the gate electrode 106 is about 1 micron width. When the gate electrode 106 is formed, n-type impurity atoms are ion implanted into the active device area 104 in a self-aligned manner with the accelerate energy of about 30 KeV. at the dose of about $3 \times 10^{13}$ cm$^{-2}$, thereby forming an n-type source and drain regions 107 and 108. The substrate 101 is paced in a high temperature ambient of about 900 degrees in centigrade for about 10 minutes for the sake of activation of the implanted impurities. The resultant structure of this stage is illustrated in FIG. 6B.

Figure 6C:
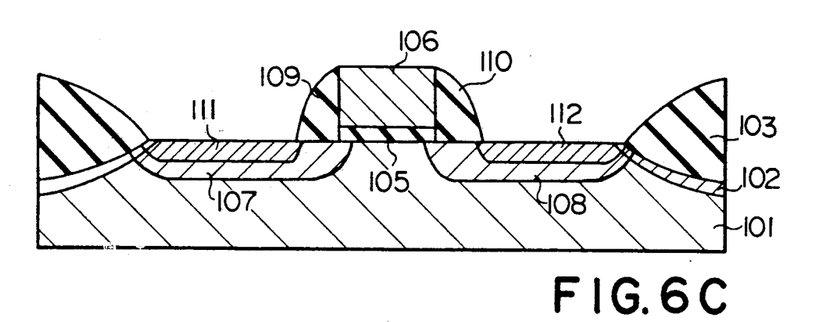

Subsequently, the substrate 101 is disposed in a reactor, and a gaseous mixture of silane and oxygen is supplied to the reactor for deposition of a silicon oxide. Then, a silicon oxide film is deposited on the entire surface of the structure by pyrolyzing silane at about 400 degrees in centigrade, and the silicon oxide film is anisotropically etched to form side walls 109 and 110. In this instance, the anisotropical etching is of the reactive ion etching, and CF$_4$ gas is used as the etchant. After the formation of the side walls 109 and 110, arsenic atoms are ion implanted into the active device area with accelerate energy of about 70 KeV. at dose of about $3 \times 10^{15}$ cm$^{-2}$ so that heavily doped n-type source and drain regions 111 and 112 are formed in a self-aligned manner with the side walls 109 and 110. The implanted arsenic atoms are activated through a heat treatment at about 900 degrees in centigrade for about thirty minutes. Thus, the LDD structure is formed in the active device area 104 as shown in FIG. 6C.

Figure 6D:
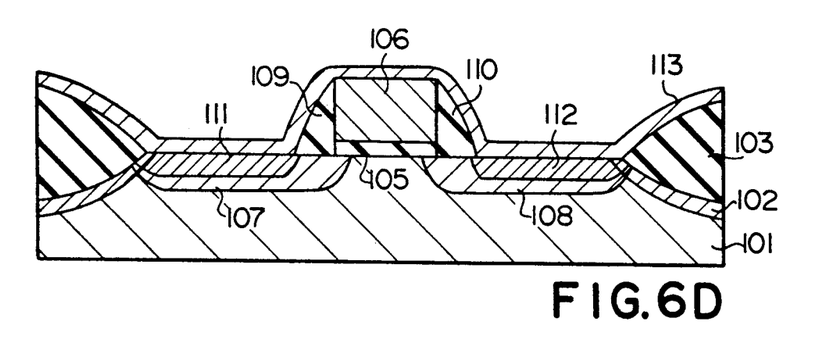

The resultant structure is placed in a DC magnetron sputtering system, and a titanium target containing about 100 ppm oxygen is sputtered to deposit a titanium film 113 to a thickness of about 700 angstroms on the entire surface of the structure as shown in FIG. 6D.

Figure 6E:
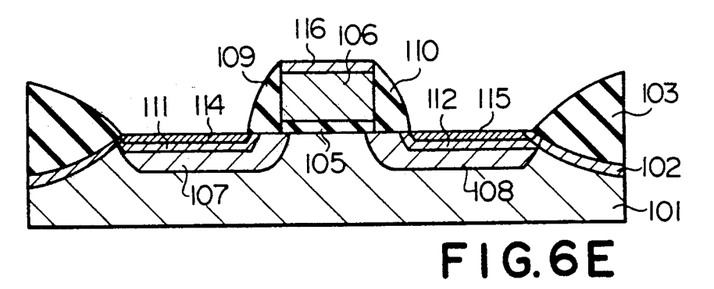
Figure 7:
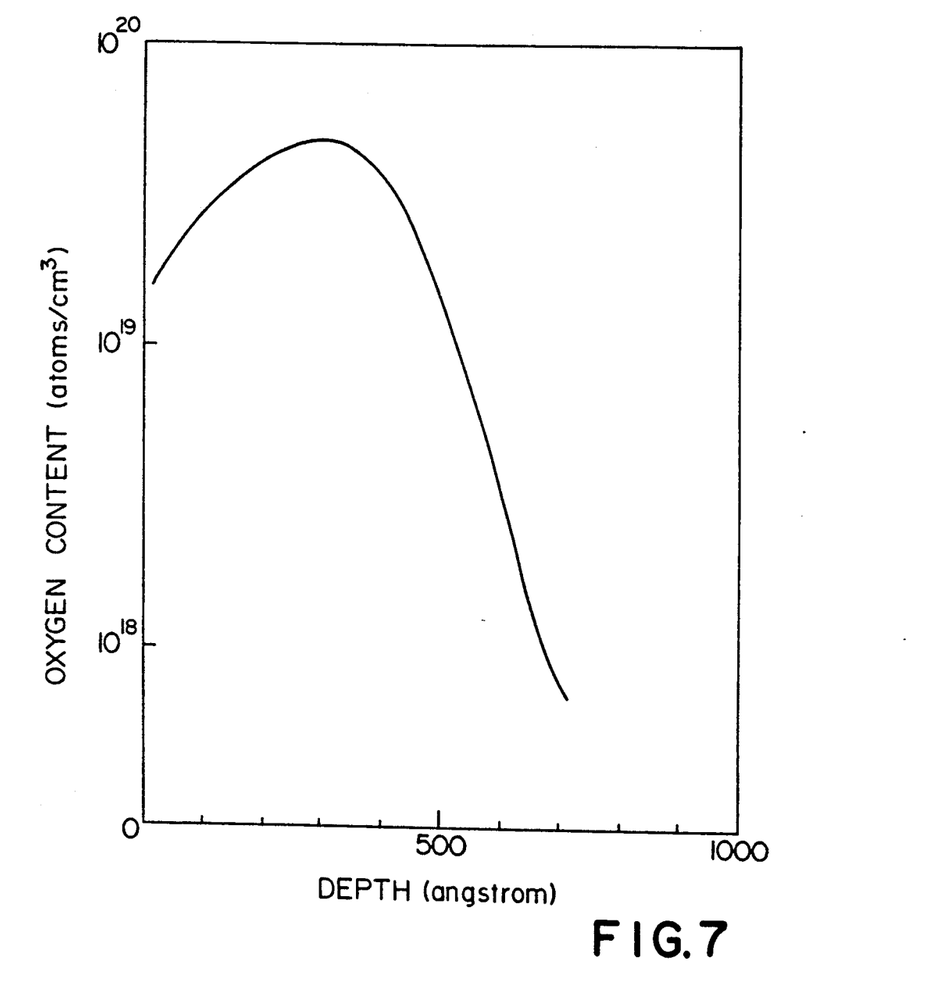
FIG. 7 is a graph showing the oxygen content in terms of the depth of the titanium silicide film incorporated in the field effect transistor fabricated through the process sequence shown in FIGS. 6A to 6G.

The titanium film 113 thus deposited is annealed in an nitrogen ambient at about 650 degrees in centigrade for about 10 minutes, and, consequently, a titanium silicide films 114, 115 and 116 are formed on the heavily doped source and drain regions 111 and 112 and the polycrystalline silicon gate electrode 116. Ammonia, hydrogen peroxide and water are mixed in a proportion of 1:1:5, and the non-converted or residual titanium are removed in the solution. The titanium silicide films 114 to 116 have respective thicknesses of about 1000 angstroms. Oxygen atoms are ion implanted into the entire surface with accelerate energy of about 10 KeV. at dose of $5 \times 10^{14} cm^{-2}$. By virtue of the ion implantation, the oxygen content is varied depending upon the depth from the surface, and the profile is illustrated in FIG. 7. The profile is not affected by heat treatments in the later stages. The resultant structure of this stage is illustrated in FIG. 6E.

Figure 6F:
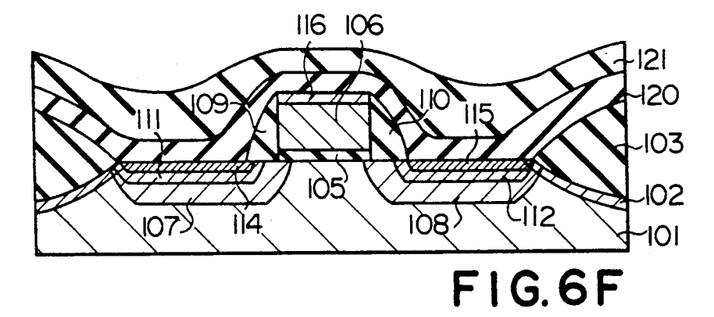

A silicon oxide film 120 is deposited to a thickness of about 1000 angstroms on the entire surface of the structure by pyrolyzing silane with oxygen at about 400 degrees in centigrade, and, thereafter, a boron-phosphosilicate glass film 121 is deposited to a thickness of about 6000 angstroms on the silicon oxide film 120 by the pyrolyzing technique at about 400 degrees in centigrade using a gaseous mixture of $SiH_4$, $B_2H_6$, $PH_4$ and $O_2$. A heat treatment is carried out in a nitrogen ambient at about 900 degrees in centigrade for about thirty minutes so that a smooth topography is created through the reflow of the boron-phosphosilicate glass. The resultant structure of this stage is illustrated in FIG. 6F.

Figure 6G:
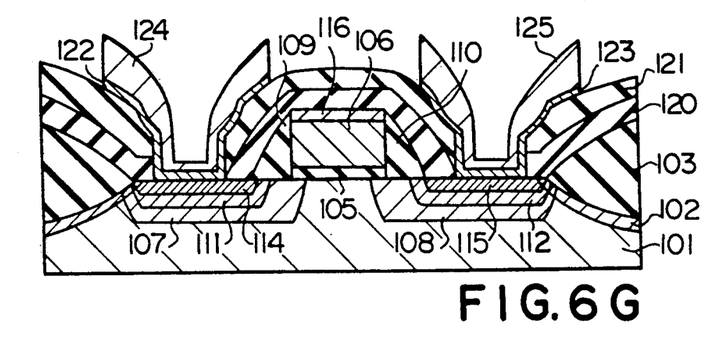

A mask player is provided on the boron-phosphosilicate glass film 121 by using lithographic techniques, and the boronphosphosilicate glass film 121 and the silicon oxide film 120 are selectively removed by using a reactive ion etching technique using a gaseous mixture of $CHF_3$ and $O_2$ so that contact holes are formed in the boron-phosphosilicate glass film 121 and the silicon oxide film 120, exposing the titanium silicide films 114 and 115. The substrate 101 is placed in the DC magnetron sputtering system, and a tungsten silicide target is sputtered to form a tungsten silicide film of about 1000 angstroms. Subsequently, an aluminum alloy containing silicon is deposited to a thickness of about 6000 angstroms, and, consequently, an aluminum alloy film is formed on the tungsten silicide film. These films are patterned by using a reactive ion etching technique so that barrier metal films 122 and 123 and metal wiring strips 124 and 125 are formed in contact with the titanium silicide films 114 and 115. Thus, a MOS type field effect transistor is fabricated through the process sequence according to the present invention, and the resultant structure is illustrated in FIG. 6G.

In the process sequence shown in FIGS. 1A to 1G, since the low purity titanium target (containing 10% oxygen by atom) is used for deposition of the titanium film 13, the titanium oxide is liable to be left on the field oxide film 2, and the residual titanium oxide deteriorates the production yield. However, the high purity titanium oxide is used to deposit the titanium film 113 which reacts on the single crystalline silicon and the polycrystalline silicon to form the titanium silicide films 114 to 116 in the process sequence shown in FIGS. 6A to 6G. Since the titanium film 113 is formed from the high purity titanium target, the titanium oxide is less liable to remain on the thick field oxide film 102, and, for this reason, the production yield is higher than that of the process sequence shown in FIGS. 1A to 1G.

The titanium oxide in the titanium silicide films 114 to 116 is stable, and is hardly diffused into the substrate 101 in the heat treatments in the later stages. For this reason, no fluctuation takes place in the device characteristics similar to the MOS type field effect transistor of the first embodiment.

As will be understood from the foregoing description, the titanium silicide film with the titanium oxide is desirable for an interconnection as well as a gate electrode of a component field effect transistor, because of the low resistivity without sacrifice of the device characteristics.

Figure 8:
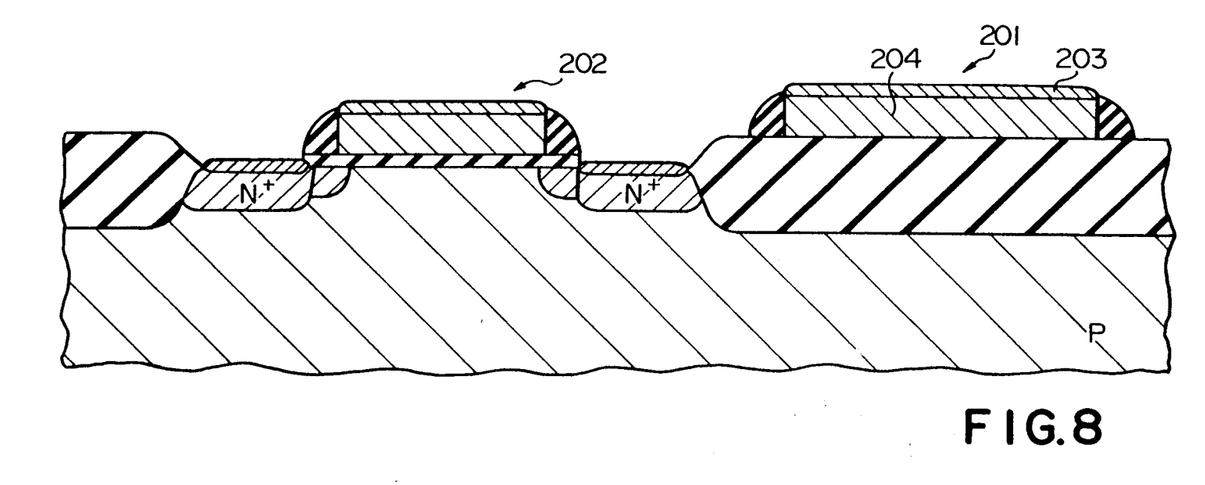
FIG. 8 is a cross sectional view showing the structure of a multiple-level interconnection embodying the present invention.

Although particular embodiments of the present invention have been shown and described, it will be obvious to those skilled in the art that various changes and modifications may be made without departing from the spirit and scope of the present invention. For example, the titanium silicide films of the present invention is applied to the MOS type field effect transistors, however, the present invention is applicable to an integrated circuit implemented by another transistor such as, for example, a bipolar transistor. Moreover, the MOS type field effect transistors respectively have the multiple-level gate electrodes each having the lower polycrystalline silicon film and the titanium silicide film, however, the multiple-level structure is applicable to a discrete interconnection 201 coupling one of the component transistors 202 to another component circuit element as shown in FIG. 8. Namely, the multiple-level interconnection 201 is provided with a lower polycrystalline silicon film 203 and an upper titanium silicide film 204 containing a titanium oxide.

What is claimed is:

1. A semiconductor device fabricated on a silicon substrate, comprising:
   (a) a transistor having impurity regions formed in a surface portion of said semiconductor substrate,
   (b) a control electrode provided over that area which is between said impurity regions for causing carriers to travel from one of the impurity regions to another impurity region, and
   (c) an interconnection coupled at one end thereof to one of said impurity regions of said transistor for providing a conduction path, in which said control electrode is formed by a titanium silicide film containing oxygen atoms in the form of a titanium oxide throughout said titanium silicide film.

2. A semiconductor device as set forth in claim 1, in which the amount of said oxygen atoms ranges from about $10^{19}$ atoms/cm$^3$ and to about $10^{21}$ atoms/cm$^3$.

3. A semiconductor device as set forth in claim 2, in which said oxygen atoms are uniformly distributed throughout the thickness thereof.

4. A semiconductor device as set forth in claim 3, in which the amount of said oxygen atoms are of the order of $10^{20}$ atoms/cm$^3$.

5. A semiconductor device as set forth in claim 2, in which said oxygen atoms are distributed in a profile having a peak value at a predetermined depth.

6. A semiconductor device as set forth in claim 2, in which said transistor is of a field effect transistor.

7. A semiconductor device as set forth in claim 6, in which aforesaid one of the impurity regions and aforesaid another impurity region serve as source and drain regions.

8. A semiconductor device as set forth in claim 7, in which said source and drain regions are respectively covered with titanium silicide films each containing oxygen atoms in the form of said titanium oxide throughout each titanium silicide film, and in which the amount of said oxygen atoms contained in each titanium silicide film ranges between about $10^{19}$ atoms/cm$^3$ and about $10^{12}$ atoms/cm$^3$.

9. A semiconductor device as set forth in claim 8, in which said semiconductor device further comprises an interconnection, and in which said interconnection has a lower conductive strip of the polysilicon and an upper titanium silicide film containing oxygen atoms in the form of the titanium oxide throughout said titanium silicide film.

10. A semiconductor device fabricated on a silicon substrate comprising a plurality of impurity regions formed in said substrate, and a plurality of electrodes provided in association with said impurity regions, in which at least one of said electrodes is formed of a titanium silicide film containing oxygen atoms in the form of a titanium oxide throughout said titanium silicide film.

11. A semiconductor device as set forth in claim 1, in which said control electrode further has a lower conductive strip formed of a polycrystalline silicon overlain by said titanium silicide film.

* * * * *